(12) United States Patent
Wu et al.

(10) Patent No.: US 6,525,559 B1
(45) Date of Patent: Feb. 25, 2003

(54) FAIL-SAFE CIRCUIT WITH LOW INPUT IMPEDANCE USING ACTIVE-TRANSISTOR DIFFERENTIAL-LINE TERMINATORS

(75) Inventors: Ke Wu, San Jose, CA (US); David Kwong, Fremont, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 10/063,416

(22) Filed: Apr. 22, 2002

(51) Int. Cl.$^7$ ............................................. H03K 19/003
(52) U.S. Cl. ............................. 326/30; 326/23; 327/546
(58) Field of Search ............................. 326/30, 33, 34, 326/21–24; 327/546

(56) References Cited

U.S. PATENT DOCUMENTS

| | | | |
|---|---|---|---|
| 5,065,047 A | 11/1991 | Igari et al. | 326/14 |
| 5,362,991 A | 11/1994 | Samela | 327/540 |
| 5,532,558 A | 7/1996 | George | 315/382.1 |
| 5,635,852 A | 6/1997 | Wallace | 326/30 |
| 6,061,806 A | 5/2000 | Caldwell et al. | 714/3 |
| 6,184,730 B1 | 2/2001 | Kwong et al. | 327/112 |
| 6,188,271 B1 * | 2/2001 | Wang et al. | 327/545 |
| 6,201,405 B1 | 3/2001 | Hedberg | 326/30 |
| 6,288,577 B1 | 9/2001 | Wong | 327/65 |
| 6,320,406 B1 | 11/2001 | Morgan et al. | 326/14 |

\* cited by examiner

*Primary Examiner*—Michael Tokar
*Assistant Examiner*—James H Cho
(74) *Attorney, Agent, or Firm*—Stuart T. Auvinen (57) ABSTRACT

A fail-safe circuit for a pair of differential input lines detects when one or both lines are open. Each line has a pull-up of a switched p-channel transistor in series with a resistor or another p-channel transistor that has its effective resistance controlled by a gate bias. The gate of the switched p-channel transistor is driven to ground when power is applied to the gate of a grounding n-channel transistor. When power is off, a p-channel connecting transistor charges the gate node from the differential input line when a positive voltage is applied to the input line, such as during a leakage test. Charging the gate node prevents the switched p-channel transistor from turning on, blocking a leakage current path through the pull-up. An N-well bias circuit can be added, which connects the N-well under p-channel transistors to power or the gate node or the input line.

20 Claims, 5 Drawing Sheets

FAIL-SAFE CIRCUIT WITH LOW INPUT IMPEDANCE USING ACTIVE-TRANSISTOR DIFFERENTIAL-LINE TERMINATORS

BACKGROUND OF INVENTION

This invention relates to differential receivers, and more particularly to fail-safe circuits for low-voltage differential signaling (LVDS) receivers.

Networking equipment often transmits signals over cables. Although the cables may be only a few meters in length, a transmission-line effect degrades data quality and transmission rate. Large signal swings also increases electro-magnetic interference (EMI) and system noise. To send signals over these cables, special drivers and receivers have been developed using reduced voltage swings and differential signaling, such as low-voltage differential signaling (LVDS) drivers and receivers.

In actual systems, cables can become disconnected, such as by a network technician when networks are updated, or when a cable fails. The transmitter can also fail or be in a high-impedance output state. At these times, neither one of the two differential output lines is driven. The voltage across a terminating resistor drops to near zero. Noise can be coupled into the cable from various sources, and this noise can be picked up by the receiver's differential inputs and amplified. False triggering of receiver logic can occur.

Figure 1:
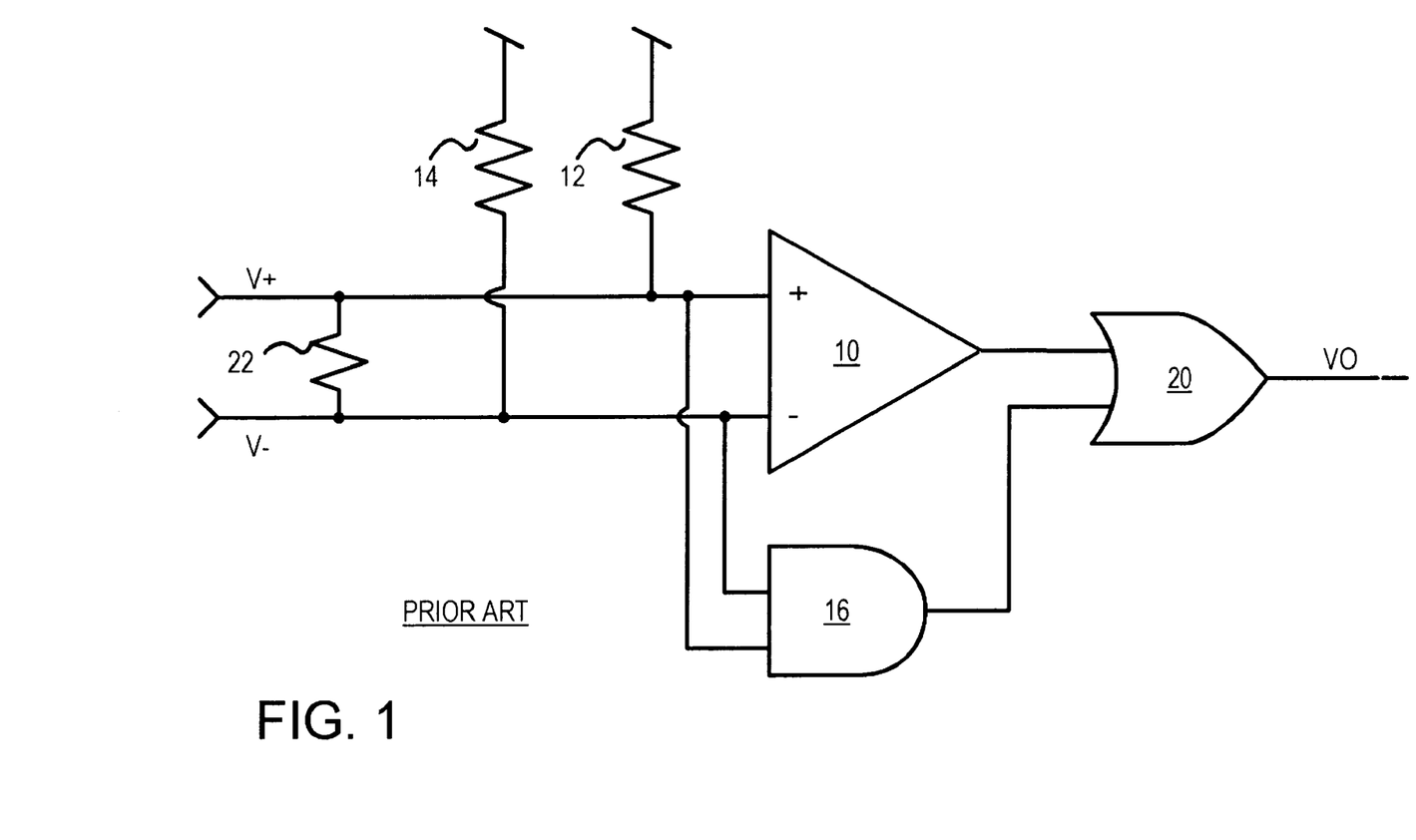
FIG. 1 shows a prior-art differential receiver and fail-safe circuit using an error-detection logic gate.

To prevent such problems, fail-safe circuits have been employed. A simply fail-safe circuit uses resistors to connect the differential lines to power and ground. FIG. 1 shows a prior-art differential receiver and fail-safe circuit using an error-detection logic gate. Differential amplifier 10 receives a differential pair of input voltages V+, V−, and amplifies the voltage difference between V+ and V− to generate its output to NOR gate 20, which generates output VO. Output VO typically is a digital signal driven fully to power and ground.

Sometimes differential inputs V+, V− are not driven by the transmitter, such as when a cable to the transmitter is disconnected, shorted together, or broken, or the transmitter is in a high-impedance state or is non-operational. When not being driven, signals V+, V− can float to indeterminate voltages, and noise can be coupled in. To prevent output VO from being in an indeterminate state, resistors 12, 14 are added.

When an open or a short occur on lines V+, V−, pull-up resistor 12 pulls signal V+ high, while pull-up resistor 14 pulls signal V− high. Since both lines V+, V− are pulled high by resistors 12, 14, no current flows through terminating resistor 22.

AND gate 16 is coupled to the inverting and non-inverting inputs of differential amplifier 10. When an open or short occurs on the cable and resistors 12, 14 pull both V+ and V− high, AND gate 16 detects the high-high condition on its inputs and outputs a high to OR gate 20. OR gate 20 drives its VO output high, since one of its inputs is high. The state of the input from differential amplifier 10 does not matter. Thus any indeterminate state of the output from differential amplifier 10 is masked by OR gate 20.

One problem with such a prior-art fail-safe circuit is that relatively large-area resistors 12, 14 are needed. It is often desired to reduced the number of discrete components in a system by integrating as many components together onto a silicon substrate or chip. For example, while resistors 12, 14 could be discrete resistors, it is desirable to integrate these resistors onto the same substrate as differential amplifier 10.

Resistors 12, 14 could be made from N-well regions patterned in the substrate. However, a large N-well area is needed for these resistors to produce a sufficiently large resistance while safely passing the currents that can occur without damaging the substrate. Also, smaller resistance values are not practical as more leakage currents would be delivered through the resistors during normal operation. Leakage currents on the same order as the differential driver's current could interfere with differential sensing by the receiver.

Large-area N-well resistors are undesirable since they have large parasitic capacitances that can slow differential signals. The higher input capacitance to differential amplifier 10 can limit high-frequency operation, especially when chip package and wire inductances and resistances are accounted for. Other resistor materials such as polysilicon may have lower resistivity requiring even larger areas. Other materials may be less reliable and more susceptible to failures due to over-heating or other mechanisms. Polysilicon resistors may have a low resistivity and require a much larger area.

Furthermore many telecom applications are often required to operate the receivers in a "hot-swap" mode. In such cases the receivers could be powered down while their inputs are still being driven. Consequently system data may be corrupted and the receivers damaged.

What is desired is a fail-safe circuit for a differential receiver. A fail-safe circuit with lower-capacitance input resistors is desirable. It is also desirable that the receiver with such a fail-safe circuit can be powered down safely without interruption.

DETAILED DESCRIPTION

The present invention relates to an improvement in fail-safe circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 2:
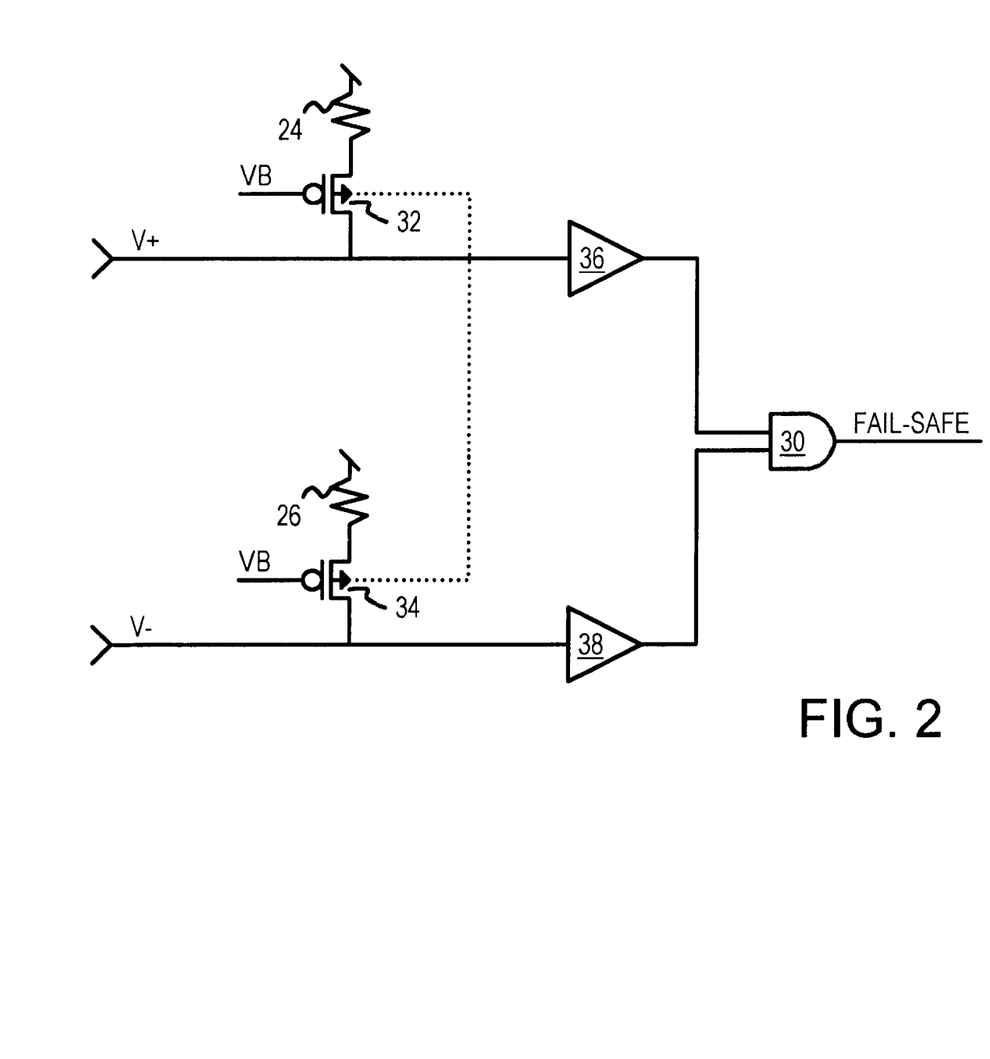
FIG. 2 is a diagram of a fail-safe circuit using p-channel transistors in series with input pull-up resistors.

FIG. 2 is a diagram of a fail-safe circuit using p-channel transistors in series with input pull-up resistors. The differential amplifier 10 is not shown in this and later figures, but has inputs connecting to differential lines V+, V−. The output of AND gate 30, signal FAIL-SAFE, drives an input to a NOR or OR gate that also receives the output of the differential receiver, as shown in FIG. 1.

AND gate 30 has inputs that are buffered from differential lines V+, V− by buffers 36, 38. Buffers 36, 38 could be simple input buffers, possibly with the threshold adjusted, or could be more complex voltage comparators or op amps that compare the voltages of V+, V− to a reference voltage level such as VDD−0.5 volt.

Resistor 24 can be smaller in size and resistance value since it is in series (between power and V+) with p-channel transistor 32. Likewise, resistor 26 is in series with p-channel transistor 34 between power and V−. The substrates (N-wells) of p-channel transistors 32, 34 can be connected together and left floating.

The channel resistance values of p-channel transistors 32, 34 can be adjusted by bias voltage VB applied to their gates. This bias voltage can be generated by a voltage-bias generator such as a simple voltage divider or by a more complex band-gap reference. Lowering VB increases the absolute value of the gate-to-source voltage, increasing current drive and lowering effective resistance of transistors 32, 34.

The resistance values of resistors 24, 26 can be lower than for resistors 12, 14 of FIG. 1. Ideally, the resistance required is reduced by the resistance of transistors 32, 34. Thus the parasitic capacitance of resistors 24, 26 is reduced. Also, this parasitic capacitance is isolated somewhat from differential lines V+, V− by transistors 32, 34. Thus the input capacitance on differential lines V+, V− is reduced significantly.

Input Leakage Test Restricts Resistor Value

Unfortunately, the resistance of resistors 24, 26 cannot be made as small as the ideal value. A larger resistance of about 200 K-ohm is still needed for each resistor 24, 26. This larger resistance is needed to reduce the power-off input leakage current, $I_{IN}$. When power is off, VDD=0 v. When an input such as V+ is raised to a test voltage such as 3.6 volts, the input current $I_{IN}$ must be below a specified value, such as 20 $\mu$A (microamps). When power is off, bias voltage VB is ground, so that gates of p-channel transistors 32, 34 are ground. When V+ is raised to 3.6 volt during the test, the source voltage (3.6 v) and gate voltage (0 v) strongly turn on p-channel transistor 32. This produces very little resistance in series with resistor 24, so the leakage current is limited mostly by resistor 24, requiring a larger resistance value of resistor 24 than what is needed during normal powered operation.

Figure 3:
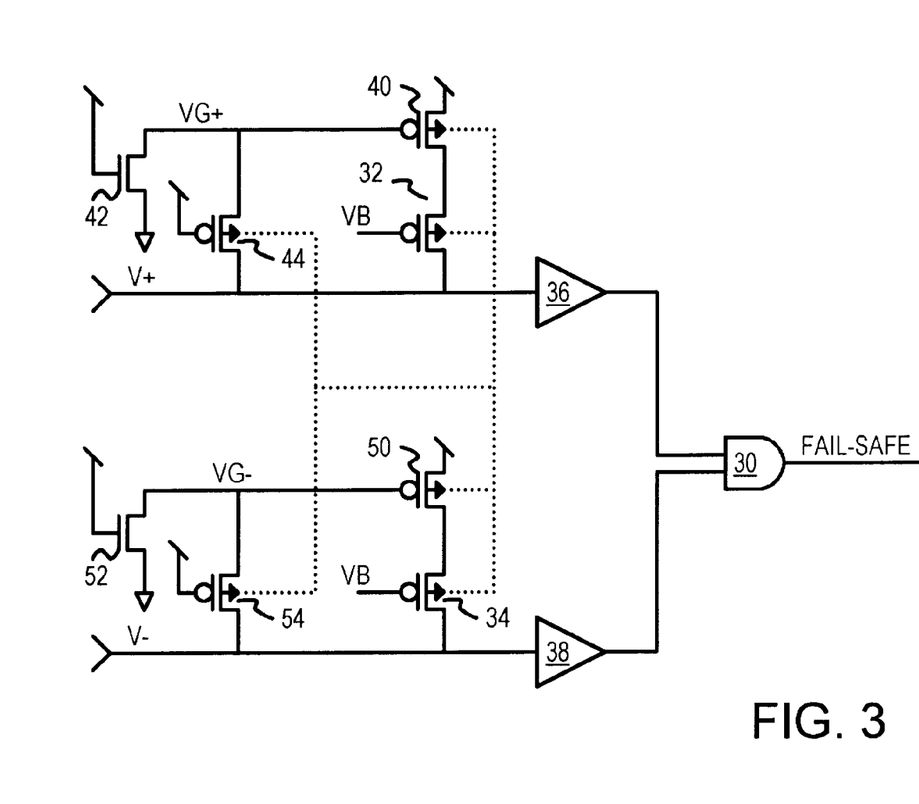
FIG. 3 is a schematic of a biasing circuit for a differential fail-safe detector.

Fail-Safe Biasing Circuit—FIG. 3

FIG. 3 is a schematic of a biasing circuit for a differential fail-safe detector. Differential lines V+, V− are buffered by buffers 36, 38 and drive inputs of AND gate 30. When both V+, V− are high, AND gate 30 drives FAIL_SAFE high to indicate a failure such as an open input line.

Pull-up p-channel transistors 32, 40 are in series between V+ and power, while pull-up p-channel transistors 34, 50 are in series between V− and power. When an input is open, one of these pairs of pull-up transistors pull the open line up to power. The effective resistance can be controlled by adjusting bias voltage VB that is applied to the gates of p-channel transistors 32, 34 as described before. Input capacitance is reduced since a large P-well resistor is not connected to the inputs V+, V−. High-frequency performance is especially improved.

During normal operation when power (VDD) is applied, grounding n-channel transistor 42, which has its gate connected to power, pulls gate node VG+ to ground. Gate node VG+ is connected to the gate of pull-up p-channel transistor 40, turning this transistor on strongly. Most of the series resistance is provided by pull-up p-channel transistor 32 rather than transistor 40.

When power is off, input leakage current through transistors 32, 40 is reduced by the operation of connecting p-channel transistor 44. Connecting p-channel transistor 44 has its gate connected to power, which is at ground when power is off. When a positive test voltage is applied to input V+ during an input-leakage test or a similar condition, the V+ node of transistor 44 becomes its source. The gate of transistor 44 is a zero volts due to the power being off. The gate-to-source voltage thus becomes less that zero, turning on connecting p-channel transistor 44. Current flows from line V+, through the channel of connecting p-channel transistor 44 to charge gate node VG+.

As gate node VG+ is charged, its voltage rises above ground. This voltage above ground is applied to the gate of pull-up p-channel transistor 40 to keep it off. Although pull-up p-channel transistor 32 may turn on during the leakage test, transistor 40 remains off. Even though transistor 32 may conduct and charge the source node between transistors 32, 40, gate node VG+ is also charged, causing the gate-to-source voltage of transistor 40 to remain close to zero. As long as the gate-to-source voltage of transistor 40 is within a threshold of zero, the current leaked through transistor 40 is low.

Designing connecting p-channel transistor 44 to conduct about as much or more current than transistor 32 allows the gate node VG+ to be charged to about the same voltage as the source node between transistors 32, 40. Of course, the amount of parasitic capacitance on the VG+ node and the source node also determine how quickly these nodes are charged. Circuit simulation can be used to adjust transistor sizes.

A similar biasing circuit of grounding n-channel transistor 52 and connecting p-channel transistor 54 drives gate node VG−. Pull-up p-channel transistor 50 has its gate driven by gate node VG−, limiting leakage current even when pull-up p-channel transistor 34 conducts.

The N-wells of p-channel transistors 32, 34, 40, 44, 50, 54 can be connected together and left floating. This N-well could also be driven by a substrate bias generator that floats the well when power is turned off.

Figure 4:
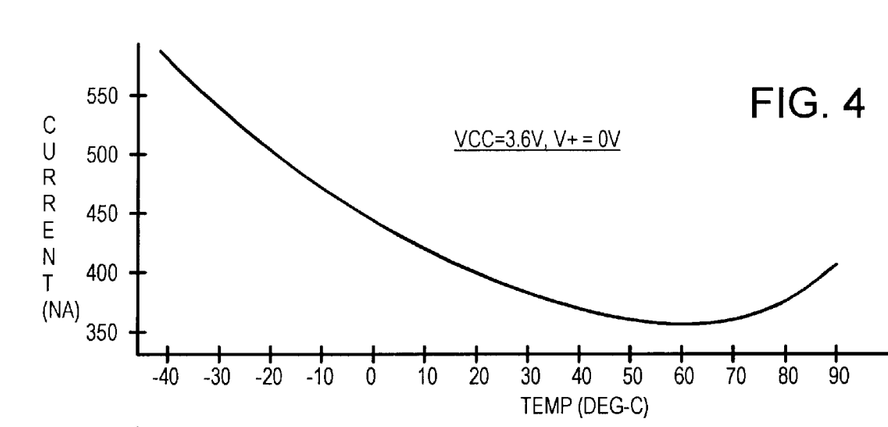
FIG. 4 is a plot of a simulation of the fail-safe circuit of FIG.

FIG. 4 is a plot of a simulation of the fail-safe circuit of FIG. 3 during normal operation. When power is applied at a maximum specified level of 3.6 volts, and the input line V+ is grounded, leakage current flows through the series pull-up p-channel transistors 32, 40. This current is about 0.6 $\mu$A at its maximum at low temperature (−40 degrees C.). The leakage current is only 0.4 $\mu$A at room temperature for one leg.

Figure 5:
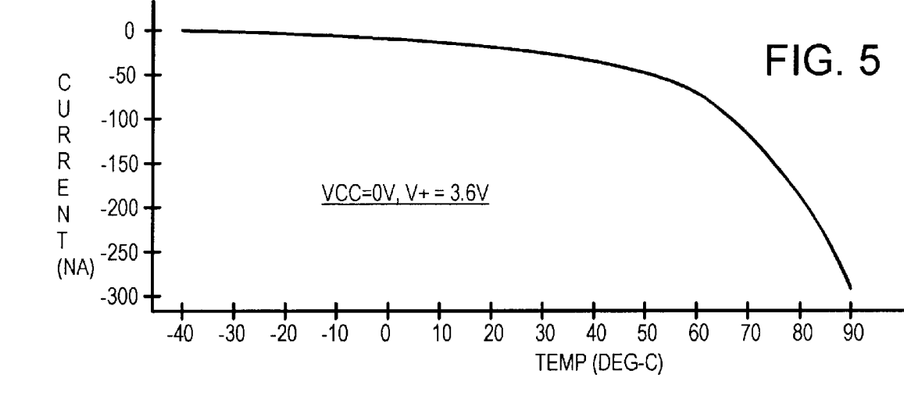
FIG. 5 is a plot of a simulation of the fail-safe circuit of FIG.

FIG. 5 is a plot of a simulation of the fail-safe circuit of FIG. 3 during a leakage test when power is off. When power is turned off (grounded), and the input line V+ has a maximum specified level of 3.6 volts applied, leakage current flows through the series pull-up p-channel transistors 32, 40 from V+ to power. This current is about−0.3 $\mu$A at its maximum at high temperature (90 degrees C.). The simulated leakage current is only a few nano-amps at room temperature showing the effectiveness of the biasing circuit in shutting off transistor 40.

Figure 6:
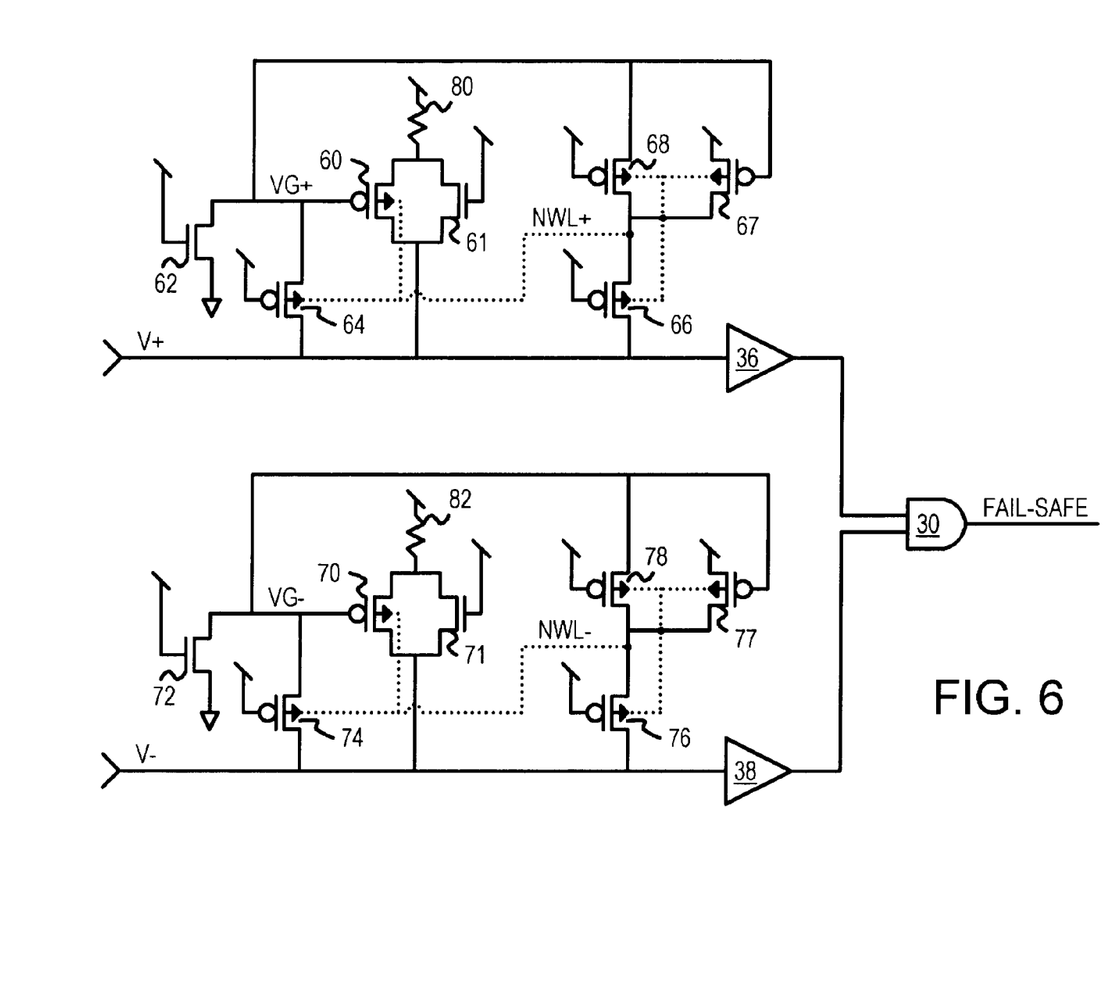
FIG. 6 is a diagram of a fail-safe circuit that actively biases the. N-well substrates.

Fail-Safe with Active Well Bias—FIG. 6

FIG. 6 is a diagram of a fail-safe circuit that actively biases the N-well substrates. Differential lines V+, V− are buffered by buffers 36, 38 and drive inputs of AND gate 30. When both V+, V− are high, AND gate 30 drives FAIL_SAFE high to indicate a failure such as an open input line as described earlier.

Line V+ is driven high when an open failure occurs by a transmission gate in series with resistor 80. The transmission gate is formed by n-channel transistor 61, which has its gate connected to power, which is connected in parallel with p-channel transistor 60. The gate of p-channel transistor 60, gate node VG+, is normally driven to ground by grounding n-channel transistor 62, which has its gate connected to power.

When power is off, and input V+ is driven high during a leakage test, connecting p-channel transistor 64 turns on, since its gate is connected to power, which is ground when power is off. Differential line V+ is the source of transistor 64, which is above the gate voltage (ground). Current from line V+ flows through transistor 64 to charge gate node VG+. Since gate node VG+ is charged above ground to nearly the same voltage as line V+, p-channel transistor 60 remains off even though its source (line V+) is above ground.

Rather than use a floating N-well, the N-well substrates,, node NWL+, for p-channel transistors 60, 64 are biased by a substrate bias circuit. N-well node NWL+ is connected to the source/drain node between p-channel transistors 66, 67, 68. A metal contact can be used or a metal strap, or other structures to make this substrate-to-source connection. P-channel transistors 60, 64, 66, 67, and 68 can be formed in the same N-well.

During normal operation when power is applied, gate node VG+ is driven low by grounding n-channel transistor 62. Gate node VG+ (at power) is applied to the gate of p-channel transistor 67, which turns on to connect power to substrate node NWL+. Thus the substrates under p-channel transistors 60, 64, 66, 67, 68 are biased to power by transistor 67 during normal operation. Since the gates of p-channel transistors 66, 68 are connected to power, they are turned off during normal operation.

When power is turned off and falls to ground, substrate node NWL+ can be connected to gate node VG+ by transistor 68, and to input line V+ by transistor 66. When line V+ rises more than a threshold above ground, transistor 66 turns on since its gate, connected to power, is at ground. Current is conducted through transistor 66 to charge the substrates of node NWL+.

Likewise, when line V+ rises and connecting p-channel transistor 64 charges gate node VG+ to more than a threshold above ground, transistor 68 turns on since its gate, connected to power, is at ground. Current is conducted through transistor 68 to charge the substrates of node NWL+.

While not necessary in all embodiments, transistor 68 can be useful when input V+ rises and falls back to ground quickly. Then node VG+ could retain some charge while input V+ has already fallen back to ground. Having a second transistor 68 allows the substrates to be charged to the higher voltage of gate node VG+. Thus substrate node NWL+ is charged to the higher voltage of either gate node VG+ or differential input line V+.

A second pull-up and biasing circuit is used for second differential input line V−. Operation is similar to described for line V+. Gate node VG− is driven to ground by grounding n-channel transistor 72 when powered, or connected to line V− through connecting p-channel transistor 74 when V− rises above ground and power is off. The substrates of p-channel transistors 70, 74, 76, 77, 78 are part of N-well node NWL−, which is driven to power by transistor 77 when power is applied. When power is off, transistor 78 connects NWL− to gate node VG−, while transistor 77 connects NWL− to input line V−.

ALTERNATE EMBODIMENTS

Several other embodiments are contemplated by the inventors. For example many different transistor sizes could be used, and additional transistors and components such as logic gates, capacitors and resistors could be added. Many different resistance values can be used, and the load or terminating resistor is normally selected to match the impedance of the V+, V− transmission lines, usually in the range of 50 to 120 Ohms. Various inversions in the logic can be introduced, and NAND gates rather than NOR gates can be substituted using DeMorgan's theorem. The inverting and non-inverting inputs to the comparators and the differential amplifier can be swapped to invert their outputs. Active-low signals rather than active-high signals can be substituted. Several gates can be combined into a larger gate, such as a 3-input AND or NAND gate.

Pull-down resistors rather than pull-up resistors could be attached to the differential inputs, and n-channel rather than p-channel transistors could be put in series with resistors. The N-wells could be biased by a Vbb generator or coupled to power rather than left floating. However, to support power down applications, the well should not be connected to Vcc, since this could forward bias the substrate diode when power is off. A substrate generator can bias the N-well to Vcc when powered up, thus improving latch-up performance. The order of transistors 32, 40 could be reversed, as could other series transistors. Resistors 80, 82 could be replaced with transistors, such as p-channel transistors with a gate bias that is used to set the effective resistance values.

While the biasing circuit has been described for operation during a leakage test when power is off and a positive test voltage is applied to a differential input, this or a similar condition can occur in real-life situations such as when disconnecting or plugging system components. The leakage test simply is a useful, defined condition that approximates these actual situations that sometimes occur.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A fail-safe biasing circuit comprising:
   a pair of differential inputs including a first differential input and a second differential input that are driven to opposite states during data reception;
   a first pull-up between the first differential input and a power supply, the first pull-up having a first switching transistor having a first channel in series with a first resistor, the first switching transistor conducting current in the first channel in response to a voltage on a first gate node connected to a gate of the first switching transistor;
   a first connecting transistor that conducts current between the first differential input and the first gate node when power is off and the power supply is grounded;
   a first grounding transistor that conducts current between a ground and the first gate node when the power is on and the power supply is not grounded;
   a second pull-up between the second differential input and a power supply, the second pull-up having a second switching transistor having a second channel in series with a second resistor, the second switching transistor conducting current in the second channel in response to a voltage on a second gate node connected to a gate of the second switching transistor;
   a second connecting transistor that conducts current between the second differential input and the second gate node when the power is off and the power supply is grounded; and
   a second grounding transistor that conducts current between a ground and the second gate node when the power is on and the power supply is not grounded, whereby leakage currents in the first and second pull-ups are reduced when power is off by biasing the first and second gate nodes to turn off the first and second switching transistors.

2. The fail-safe biasing circuit of claim 1 further comprising:
   a first input buffer receiving the first differential input and generating a first output;
   a second input buffer receiving the second differential input and generating a second output;
   a logic gate, receiving the first and second outputs, for activating a fail-safe signal when both the first and second differential inputs are in a high state, whereby open differential inputs are detected.

3. The fail-safe biasing circuit of claim 2 wherein the first resistor is a first resistive transistor having a gate coupled to a bias voltage, the bias voltage determining an effective resistance of the first resistive transistor when power is applied to the fail-safe biasing circuit.

4. The fail-safe biasing circuit of claim 2 wherein the first switching transistor is connected to the first differential input and the first resistor is connected to the power supply,
   whereby the first differential input is separated from the first resistor by the first switching transistor.

5. The fail-safe biasing circuit of claim 4 wherein the first resistor is formed as a well region in a substrate.

6. The fail-safe biasing circuit of claim 2 wherein the first switching transistor and the first connecting transistor are p-channel transistors;
   wherein the first grounding transistor is an n-channel transistor;
   wherein the second switching transistor and the second connecting transistor are p-channel transistors;
   wherein the second grounding transistor is an n-channel transistor.

7. The fail-safe biasing circuit of claim 6 wherein the first pull-up further comprises:
   a parallel n-channel transistor having a gate connected to the power supply, and having a conducting channel in parallel to the first channel of the first switching transistor;
   wherein the second pull-up further comprises:
   a parallel n-channel transistor having a gate connected to the power supply, and having a conducting channel in parallel to the second channel of the second switching transistor,
   whereby parallel n-channel and p-channel transistors in the first pull-up conduct current to the first resistor and parallel n-channel and p-channel transistors in the second pull-up conduct current to the second resistor.

8. The fail-safe biasing circuit of claim 7 wherein the first and second switching transistors and the first and second connecting transistors are formed in an N-well that is not connected to the power supply.

9. The fail-safe biasing circuit of claim 8 wherein the N-well is floating.

10. The fail-safe biasing circuit of claim 6 wherein the first and second switching transistors and the first and second connecting transistors are formed in a first N-well;
    wherein the second and second switching transistors and the second and second connecting transistors are formed in a second N-well.

11. The fail-safe biasing circuit of claim 10 further comprising:
    a first well-powering transistor that conducts current from the power supply to the first N-well when power is on;
    a first well-input transistor that conducts current from the first differential input to the first N-well when the power supply is grounded and the first differential input is above ground;
    a second well-powering transistor that conducts current from the power supply to the second N-well when power is on;
    a second well-input transistor that conducts current from the second differential input to the second N-well when the power supply is grounded and the second differential input is above ground.

12. The fail-safe biasing circuit of claim 11 further comprising:
    a first well-gate transistor that conducts current from the first gate node to the first N-well when the power supply is grounded and the first gate node is above ground;
    a second well-gate transistor that conducts current from the second gate node to the second N-well when the power supply is grounded and the second gate node is above ground.

13. The fail-safe biasing circuit of claim 12 wherein a gate of the first well-input transistor is grounded, a gate of the first well-gate transistor is grounded, a gate of the second well-input transistor is grounded, and a gate of the second well-gate transistor is grounded.

14. The fail-safe biasing circuit of claim 13 wherein a gate of the first well-powering transistor is coupled to the first gate node, and a gate of the second well-powering transistor is coupled to the second gate node.

15. A fail-safe detector comprising:
    a first pull-up having in series a first resistor means for producing a first resistance when a first current flows through the first pull-up, and a first switching transistor means for blocking the first current in response to a first gate, the first pull-up coupled between a power supply and a first differential input;

first grounding transistor means for grounding the first gate when the power supply is activated;

first connecting transistor means for connecting the first gate to the first differential input when the power supply is not activated but the first differential input is activated with a positive voltage above a threshold;

a second pull-up having in series a second resistor means for producing a second resistance when a second current flows through the second pull-up, and a second switching transistor means for blocking the second current in response to a second gate, the second pull-up coupled between a power supply and a second differential input;

second grounding transistor means for grounding the second gate when the power supply is activated;

second connecting transistor means for connecting the second gate to the second differential input when the power supply is not activated but the second differential input is activated with a positive voltage above a threshold; and logic means, receiving the first and second differential inputs, for signaling a failure when both the first and second differential inputs are in a high state.

16. The fail-safe detector of claim 15 wherein the first resistor means is a resistor or is a p-channel transistor having a gate coupled to a resistance-setting bias voltage when power is activated;

wherein the second resistor means is a resistor or is a p-channel transistor having a gate coupled to a resistance-setting bias voltage when power is activated.

17. The fail-safe detector of claim 16 further comprising:

first well-bias means for biasing a first well under the first connecting transistor means and under the first switching transistor means, wherein the first well-bias means connects the power supply to the first well when the power supply is activated, but connects the first differential input to the first well or connects the first gate to the first well when the power supply is not activated; and second well-bias means for biasing a second well under the second connecting transistor means and under the second switching transistor means, wherein the second well-bias means connects the power supply to the second well when the power supply is activated, but connects the second differential input to the second well or connects the second gate to the second well when the power supply is not activated, whereby the first and second wells are biased.

18. The fail-safe detector of claim 17 wherein the first pull-up further comprises first opposite-polarity transistor means for conducting a portion of the first current in parallel with the first switching transistor means;

wherein the second pull-up further comprises second opposite-polarity transistor means for conducting a portion of the second current in parallel with the second switching transistor means.

19. A fail-safe biasing circuit comprising:

a first switching transistor having a gate coupled to a first gate node, a source coupled to a first intermediate node, and a drain coupled to a first differential line;

a first resistive transistor having a gate coupled to a bias voltage, a drain coupled to the first intermediate node, and a source coupled to a power supply;

a first grounding transistor having a gate coupled to the power supply, a source coupled to a ground, and a drain coupled to the first gate node;

a first connecting transistor having a gate coupled to the power supply, a source coupled to the first gate node, and a drain coupled to the first differential line;

a second switching transistor having a gate coupled to a second gate node, a source coupled to a second intermediate node, and a drain coupled to a second differential line;

a second resistive transistor having a gate coupled to a bias voltage, a drain coupled to the second intermediate node, and a source coupled to a power supply;

a second grounding transistor having a gate coupled to the power supply, a source coupled to a ground, and a drain coupled to the second gate node;

a second connecting transistor having a gate coupled to the power supply, a source coupled to the second gate node, and a drain coupled to the second differential line.

20. The fail-safe biasing circuit of claim 19 wherein the first and second grounding transistors are n-channel transistors while the first and second switching transistors, the first and second resistive transistors, and the first and second connecting transistors are p-channel transistors.

* * * * *